United States Patent
Clark, Jr. et al.

(10) Patent No.: US 6,664,150 B2
(45) Date of Patent: Dec. 16, 2003

(54) ACTIVE WELL SCHEMES FOR SOI TECHNOLOGY

(75) Inventors: William F. Clark, Jr., Essex Junction, VT (US); Edward J. Nowak, Essex Junction, VT (US); Jed H. Rankin, South Burlington, VT (US); Minh H. Tong, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/205,528

(22) Filed: Jul. 25, 2002

(65) Prior Publication Data

US 2003/0080383 A1 May 1, 2003

Related U.S. Application Data

(62) Division of application No. 09/682,868, filed on Oct. 26, 2001.

(51) Int. Cl.[7] .......................... H01L 21/00; H01L 21/84; H01L 21/8249; H01L 29/40
(52) U.S. Cl. ........................ 438/154; 438/155; 438/207; 438/231; 438/303; 257/E21.77; 148/DIG. 150; 148/DIG. 77
(58) Field of Search .................... 438/154, 155, 438/231, 303, 207; 148/DIG. 150, DIG. 77; 257/E21.77

(56) References Cited

U.S. PATENT DOCUMENTS

| | | |
|---|---|---|
| 4,683,637 A | 8/1987 | Varker et al. |
| 4,700,454 A | 10/1987 | Baerg et al. |
| 4,778,775 A | 10/1988 | Tzeng |
| 4,899,202 A * | 2/1990 | Blake et al. ............... 257/336 |
| 4,946,799 A * | 8/1990 | Blake et al. ............... 438/154 |
| 4,963,502 A | 10/1990 | Teng et al. |
| 5,049,513 A * | 9/1991 | Eklund ..................... 438/154 |

(List continued on next page.)

OTHER PUBLICATIONS

A.A. Evtukh et al., "Parameters of the tip Arrayscovered by Low Work Function Layers", 1995, Vacuum Microelectronics Conference, 1995, IVMC, 1995 International, 1995 pp. 529–539.*

Chu P.K. et al, "Microcavities formed by Hydrogen or Helium Plasma Immersion Ion Implantation", 1998, Ion Implantation technology Proceddings, 1998 International Conference, vol. 2, 1998 pp. 1238–1241.*

Chu P.K, "Microcavity Engineering using Plasma Immmersion Ion Implatantion", 1998, Solid–State and Integrated Circuit Technology, 1998, Proceedings, 1998, 5 th International Confereence, pp. 83–86.*

"SOI MOSFET with Buried Body Strap by Wafer Bonding", Stephen C. Kuehne, et al., IEEE Transactions on Electron Devices, vol. 45, No. 5, pp. 1084–1091 (May 1998).

"CMOS with Active Well Bias for Low–Power and RF/Analog Applications", Clent Wann, et al., Infineon Technologies, Hopewell Junction, New York.

*Primary Examiner*—Wael Fahmy
*Assistant Examiner*—Shrinivas H. Rao
(74) *Attorney, Agent, or Firm*—Scully, Scott, Murphy & Presser; Mark F. Chadurjian (57) ABSTRACT

A semiconductor device fabricated on a silicon-on-insulator substrate and having an active well scheme as well as methods, including a non-self-aligned and self-aligned, of fabricating such a device are disclosed herein. The semiconductor device includes field effect transistor 124 comprising at least body region 127 and diffusion regions 132; buried interconnect plane 122 optionally self-aligned to diffusion regions 132 and in contact with body region 127; isolation oxide region 118 between diffusion regions 132 and buried interconnect plane 122; and buried oxide layer 104 present beneath buried interconnect plane 122.

8 Claims, 7 Drawing Sheets

U.S. PATENT DOCUMENTS

| | | | |
|---|---|---|---|
| 5,087,580 A | * | 2/1992 | Eklund .................. 438/155 |
| 5,102,809 A | * | 4/1992 | Eklund et al. ............ 438/154 |
| 5,137,837 A | | 8/1992 | Chang et al. |
| 5,144,390 A | * | 9/1992 | Matloubian ................ 257/347 |
| 5,260,233 A | | 11/1993 | Buti et al. |
| 5,306,667 A | | 4/1994 | Shappir |
| 5,332,913 A | | 7/1994 | Shappir |
| 5,382,832 A | | 1/1995 | Buti et al. |
| 5,386,135 A | | 1/1995 | Nakazato et al. |
| 6,097,242 A | | 8/2000 | Forbes et al. |
| 6,198,142 B1 | | 3/2001 | Chau et al. |
| 6,348,373 B1 | * | 2/2002 | Ma et al. .................. 438/240 |
| 6,352,909 B1 | * | 3/2002 | Usenko ..................... 438/458 |

\* cited by examiner

ACTIVE WELL SCHEMES FOR SOI TECHNOLOGY

RELATED APPLICATIONS

This application is a divisional of U.S. application Ser. No. 09/682,868, filed Oct. 26, 2001.

BACKGROUND OF THE INVENTION

FIELD OF THE INVENTION

The present invention relates to semiconductor devices, and more particularly to semiconductor devices that are fabricated on a silicon-on-insulator (SOI) substrate wherein the devices contain an active well region formed therein.

To obtain optimal tradeoffs between high drive current $I_{dsat}$ and low off current $I_{off}$, device and circuit designers are looking at various approaches including active wells. In an active well design, the standby current can be kept low by raising the field effect transistor (FET) threshold voltage $V_t$, hence reducing the sub-threshold leakage current. The threshold voltage level is adjusted by biasing the isolated well containing the FET. During an active cycle, the well is biased to lower the $V_t$ for high switching speeds.

There are several ways of making active wells work in bulk complementary metal oxide semiconductor (CMOS) technology. The simplest way is to implement a triple-well process in which both NFET and PFET bodies are contained in isolated wells. This prior art bulk process requires an extra masking step and extra penalizing layout rules. Moreover, this prior art approach has high well capacitance, which is a challenge to bias quickly with low power.

Insofar as silicon-on-insulator (SOI) technology is concerned, there is no easy way to implement an active well process in such technology. One method of making low-resistance body contacts using a wafer bonding technique is described, for example, in S. Kuehne, et al. "SOI MOSFET with Buried Body Strap by Wafer Bonding", IEEE Trans. Electron Devices, Vol. 45, pp. 1084–1091, May 1998.

Figure 1A:
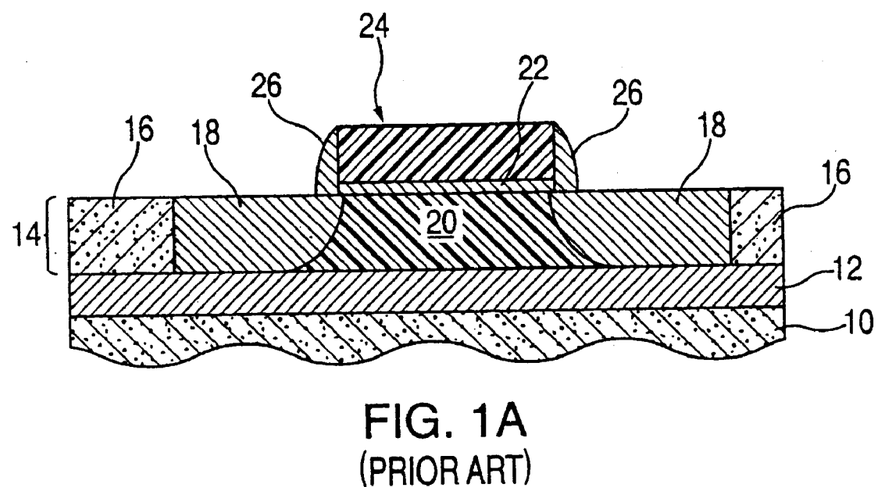

A typical SOI NFET structure is shown, for example, in FIG. 1A. Specifically, the SOI NFET of FIG. 1A comprises buried oxide layer 12 sandwiched between Si-containing substrate 10 and top Si-containing layer 14. Note that top Si-containing layer is the layer of the SOI substrate in which active devices will be formed. As shown, top Si-containing layer includes isolation regions 16, n+ diffusion regions 18 and p-body region 20. The prior art SOI NFET also contains gate dielectric 22 and gate stack 24 formed atop the top Si-containing layer as well as spacers 26 that are formed on the exposed vertical sidewalls of at least gate stack 24. In such a structure, the p-body is highly resistive and is not easily shared among many devices.

Figure 1B:
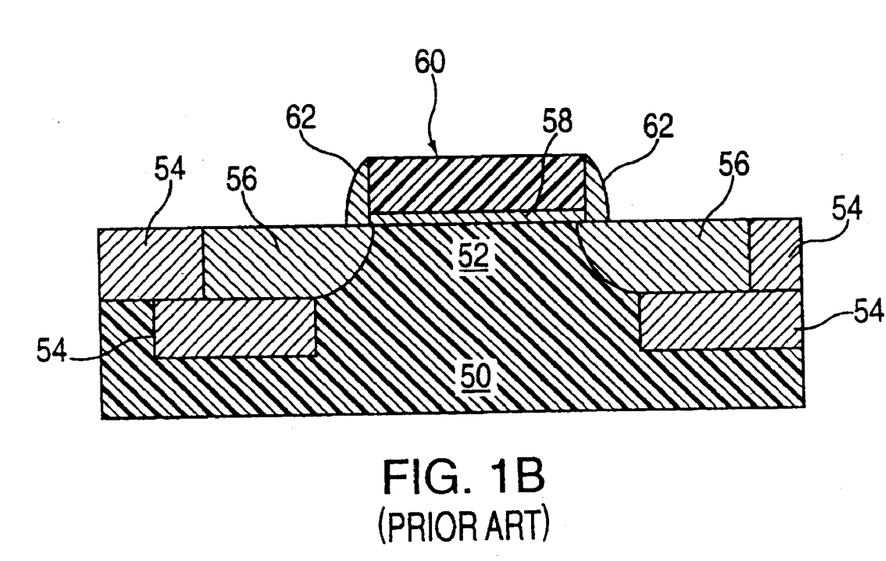

A bulk CMOS device design, which is complementary to the SOI design shown in FIG. 1A, is shown in FIG. 1B. Specifically, the device design shown in FIG. 1B comprises p substrate 50 having p-body 52, shallow trench isolation regions 54 and n+ diffusion regions 56 formed therein. Atop of substrate 50 is the gate of the device, which comprises gate dielectric 58, gate stack 60 and sidewall spacers 62. The structure shown in FIG. 1B has lower junction capacitance and may provide tighter well layout rules than a conventional bulk CMOS structure. Despite these advantages, however, the bulk CMOS structure shown in FIG. 1B suffers from having high well capacitance, thus making the SOI structure of FIG. 1A more desirable.

It is noted that SOI technology is becoming increasingly important since it permits the formation of high-speed circuits. Moreover, SOI devices offer many more advantages over their bulk counterparts including, higher performance, absence of latch-up, higher packing density and low voltage applications. In view of the advantages of SOI devices over bulk CMOS devices, there is a need for developing an active well process for SOI technology that can be easily implemented and that will afford the above advantages of active wells in SOI devices.

BRIEF SUMMARY OF THE INVENTION

One object of the present invention is to provide a semiconductor device that is fabricated on an SOI substrate wherein the device contains an active well region therein.

Another object of the present invention is to provide a semiconductor device that is fabricated on an SOI substrate wherein control of the well potential is achieved without the need of using metallic contacts.

A further object of the present invention is to provide a semiconductor device that is fabricated on an SOI substrate wherein optimal tradeoffs between high drive current $I_{dsat}$ and low off current $I_{off}$ are achieved.

A yet further object of the present invention is to provide a semiconductor device that is fabricated on an SOI substrate in which the body of the device has a low resistance and can be easily shared among many devices.

These and other objects and advantages are achieved by adding a buried interconnect plane to a structure between the top Si-containing layer and the buried oxide layer of an SOI substrate. The buried interconnect plane employed in the present invention is either p+ for an NFET or n+ doped for a PFET. Due to the low-resistance of the interconnect plane, many FETs can share the same well region.

One aspect of the present invention relates to a semiconductor device which is fabricated on an SOI substrate. Specifically, the semiconductor device of the present invention comprises:

a field effect transistor structure comprising at least a body and diffusion regions;

a buried interconnect plane contacting the body and, optionally self-aligned to the diffusion regions;

an isolation oxide region between the diffusion regions and the buried interconnect plane; and a buried oxide layer present beneath said buried interconnect plane, said buried oxide layer present atop a Si-containing substrate.

In the semiconductor device of the present invention, the diffusion regions, the body of the FET and the buried interconnect plane form a non-rectifying electrically conductive path.

More specifically, the semiconductor device of the present invention comprises:

a field effect transistor structure comprising a gate stack, a gate dielectric, source/drain diffusions, sidewall spacers, and a body;

a buried interconnect plane on a first surface of a buried oxide layer opposing a second surface of said buried oxide layer in contact with a Si-containing substrate, the buried interconnect plane contacting the body of said field effect transistor and, optionally self-aligned to the source/drain diffusions;

an isolation oxide region adjacent to said body, the isolation oxide region being between said source/drain diffusions and the buried interconnect plane.

Another aspect of the present invention relates to various methods for forming the above-mentioned SOI device which includes an active well region formed therein. One method of the present invention relates to a non-self-aligned method of fabricating the inventive structure.

Specifically, the non-self-aligned method includes the steps of:

(a) forming a silicon-on-insulator substrate (SOI) substrate, said SOI substrate having a patterned top Si-containing layer present atop a buried oxide region which includes areas that are exposed;

(b) forming a mask over a portion of said patterned top Si-containing layer;

(c) forming regions of porous Si in portions of said patterned top Si-containing layer not protected by said mask;

(d) removing the mask and the regions of porous Si from said patterned top Si-containing layer so as to provide a cavity in said regions previously occupied by porous Si;

(e) forming an isolation oxide region within said cavity; and (f) forming a field effect transistor on a portion of said patterned top Si-containing layer, wherein said field effect transistor includes at least diffusion regions formed within said top Si-containing layer above said isolation oxide region, said diffusion regions being separated by a body region.

Note a deep implant region, which forms the interconnect plane of the inventive device, can be formed immediately after step (c) or after step (f).

In another embodiment of the present invention, a self-aligned method of forming the inventive SOI structure containing active well formed therein is provided. In the self-aligned method, the method of the present invention comprises the steps of:

(a) forming an SOI substrate comprising at least a buried oxide region having a patterned top Si-containing layer formed on a portion of said buried oxide region;

(b) forming a patterned gate level on a portion of said patterned top Si-containing layer, said patterned gate level including at least a hardmask formed atop a gate material;

(c) forming sidewall spacers on portions of said patterned gate level;

(d) forming porous Si regions within said patterned top Si-containing layer;

(e) removing said hardmask and said porous Si regions;

(f) forming an oxide within said removed porous Si regions and forming an oxide layer over said buried oxide region, said patterned top Si-containing layer, said sidewall spacers and said gate material; and (g) etching back portions on said oxide layer so as to expose at least a portion of said patterned top Si-containing layer abutting said patterned gate level, while leaving oxide in at least said removed porous silicon regions.

Note a deep implant region, which forms the interconnect plane of the inventive device, can be formed after step (d).

BRIEF DESCRIPTION OF THE SEVERAL VIEWS OF THE DRAWINGS

FIGS. 1A and 1B are pictorial representations (through cross-sectional views) showing prior art MOSFET devices which contain an active well region therein; FIG. 1A is an example of a prior art SOI NFET; and FIG. 1B is a prior art bulk NFET that has been modified to reduce junction capacitance.

FIGS. 2A and 2B are pictorial representations (through cross-sectional views) showing the inventive active-well SOI FET device; FIG. 2A is an active-well SOI NFET; and FIG. 2B is an active-well SOI PFET in which well connection is made using n+ source/drain diffusion regions.

DETAILED DESCRIPTION OF THE INVENTION

The present invention, which relates to an active-well SOI device and to various methods of making the same, will now be described in greater detail by referring to the drawings that accompany the present application. It is noted that in the accompanying drawings like and/or corresponding elements are referred to by like reference numerals.

Figure 2A:
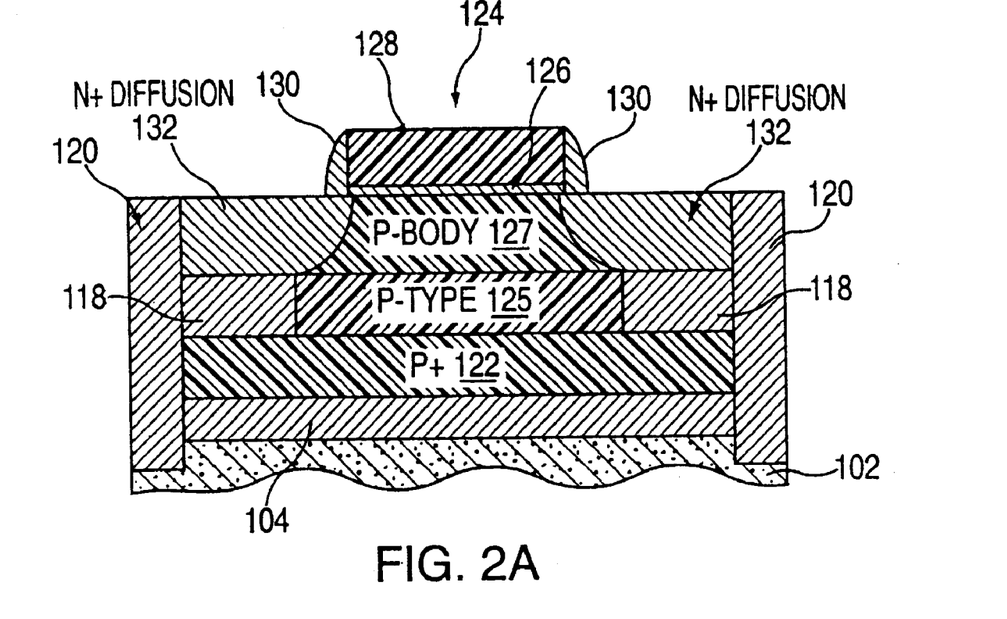
Figure 2B:
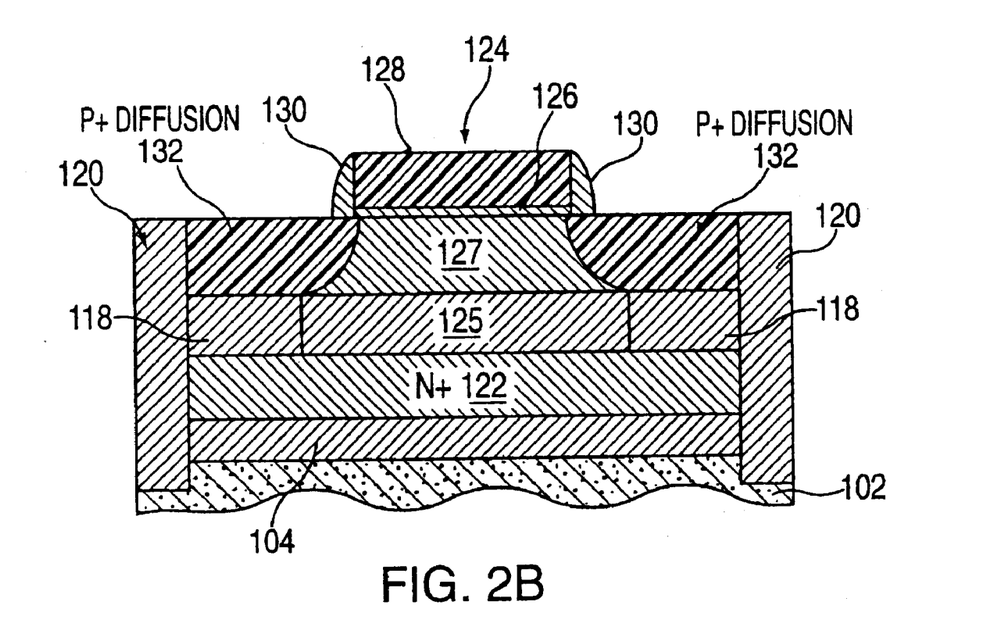

Reference is first made to FIG. 2A which illustrates the inventive active-well SOI NFET structure of the present application. Specifically, FIG. 2A comprises an active-well SOI NFET structure that includes buried oxide layer 104 formed atop a surface of Si-containing substrate 102, a buried p+ interconnect plane 122 on said buried oxide layer, isolation oxide regions 118 present on a portion of said buried interconnect plane, p-type implant region 125 present on other portions of said buried interconnect plane and the isolation oxide regions; n+ diffusion regions 132 and high resistance p-body region 127 present atop of the isolation oxide regions and the implant region. The inventive structure also includes FET 124 formed atop the n+ diffusion regions and the high-resistance body region of 127. The FET region includes gate dielectric 126, gate stack 128, and sidewall spacers 130 that are formed on exposed vertical sidewalls of the gate stack. Optional isolation trench regions 120 are present in the illustrated structure to provide better isolation and higher density to the structure. In one embodiment of the present invention, isolation trench regions 120 are deep isolation trench regions as shown. In another embodiment, isolation trench regions 120 are shallow trench isolation regions which do not completely reach substrate 102; they do however reach the depth of implant regions 118. FIG. 2B is similar to FIG. 2A except that diffusion regions 132 are p+ instead of n+ and buried interconnect region 122 is n+ instead of p−, region 125 is n-type and body 127 is n-type.

The structures shown in FIGS. 2A and 2B may be modified by changing the buried interconnect plane from a p+ layer to a n+ layer. The p+ buried interconnect plane is used in circumstances wherein a PFET device is being fabricated.

A bias scheme in which the threshold voltages of the NFET and PFET are set for optimal speed when the wells are biased at ground and $V_{dd}$, respectively is employed in the present invention. In other words, the threshold voltages are designed to be low at typical operation conditions. A fuse scheme is then employed such that the bias voltage will be set during $I_{ddq}$ testing to ensure the standby current meets the required specifications. This can be done by adjusting the charge pump frequency.

The various materials and processes used in forming the structures shown in FIGS. 2A–2B will now be described in greater detail by referring to the description that appears hereinbelow. In accordance with the present invention, the structures shown in FIGS. 2A–2B may be formed by either a non-self-aligned method or a self-aligned method. The non-self-aligned method of the present invention will be discussed first, followed by the self-aligned method.

Figure 3A:
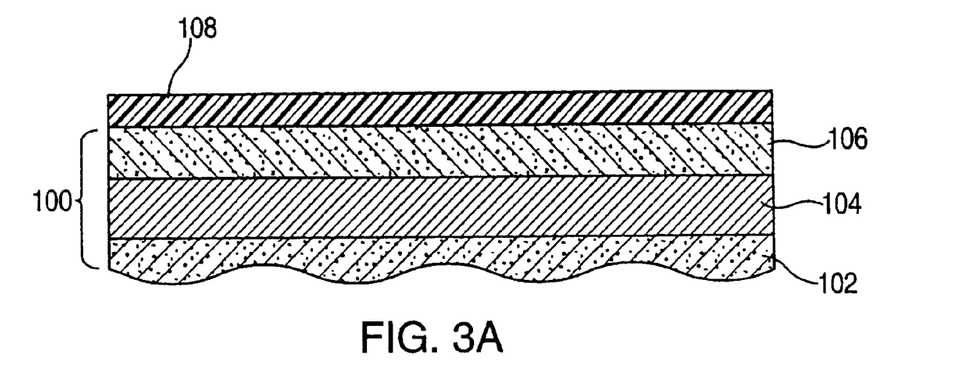
FIGS. 3A–3G are pictorial representations (through cross-sectional views) showing the inventive active-well SOI structure through various processing steps of the present invention using a non-self-aligned embodiment.

The non-self-aligned method of the present invention utilizes the initial structure shown in FIG. 3A. Specifically, the initial structure shown in FIG. 3A comprises an SOI substrate 100 having pad film layer 108 formed thereon. The SOI substrate includes buried oxide layer 104 which is sandwiched between top Si-containing layer 106 and bottom Si-containing layer 102. Note that the bottom Si-containing layer is the substrate of the device, whereas the top Si-containing layer is the layer wherein active device regions will be subsequently formed therein.

The term "Si-containing layer" as used herein denotes any semiconducting material that includes silicon. For example, the Si-containing layer may comprise Si, SiGe, Si/Ge, and Si/SiGe.

The SOI substrate employed in the present invention is fabricated using techniques well known to those skilled in the art. For example, the SOI substrate may be formed by a conventional bonding and cutting process, or alternatively, a conventional separation by implantation of oxygen (SIMOX) process may be employed in forming the same.

The thickness of the various SOI layers is not critical to the present invention, but typically, top Si-containing layer 106 of SOI substrate 100 has a thickness of from about 100 to about 1000 nm, with a thickness of from about 400 to about 600 nm being more highly preferred. Buried oxide region 104 of SOI substrate 100, which isolates top Si-containing layer 106 from bottom Si-containing layer 102, has a thickness of from about 70 to about 1000 nm, with a thickness of from about 100 to about 150 nm being more highly preferred. The thickness of the bottom Si-containing layer is inconsequential to the present invention.

Pad film layer 108 is then formed on the surface of top Si-containing layer 106 utilizing conventional processes well known in the art. For example, the pad film layer may be formed by a conventional deposition process such as chemical vapor deposition (CVD), plasma-assisted CVD, evaporation, sputtering and chemical solution deposition, or alternatively, the pad film layer may be formed by a conventional thermal growing process such as oxidation, nitridation or oxynitridation.

The pad film layer is comprised of a dielectric material such as an oxide, nitride, oxynitride or any combination and multilayer thereof, e.g., the pad film layer may comprise a dielectric stack including an oxide layer and a nitride layer. The thickness of pad film layer 108 may vary depending on the process used in forming the same, but typically, the pad film layer has a total thickness of from about 100 to about 500 nm. More preferably, the pad film layer has a total thickness of from about 150 to about 250 nm, and consists of a stack of $Si_3N_4$ upon $SiO_2$.

Next, a photoresist (not shown in the drawings) is applied to pad film layer 108 of FIG. 3A using a conventional deposition process well known in the art such as spin on coating. After application of the photoresist, a conventional lithography process followed by an etching step is employed to pattern the pad films and top Si-containing layer. Note that the patterned top Si-containing layer has sidewall portions 107 that extend to the surface of the buried oxide region at an angle, a, 90 or greater (see, for example, the resultant structure shown in FIG. 3B). The lithography process includes exposing the photoresist to a pattern of radiation and developing the pattern by utilizing a conventional developer solution. The etching step employed in transferring the pattern to the top Si-containing layer includes any etching process which has a high selectivity in removing pad film layer and Si-containing layer as compared to the underlying buried oxide region. An example of an etching process that may be employed at this point of the present invention is a fluorine-containing plasma.

Figure 3B:
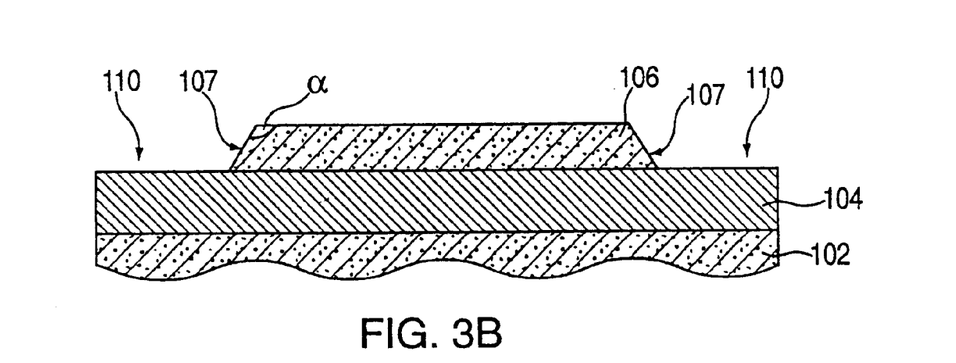

Following the etching step, the patterned photoresist and remaining pad film layer not etched during patterning are removed from the structure utilizing conventional stripping processes well known in the art so as to provide the structure shown, for example, in FIG. 3B. Note that in FIG. 3B reference numeral 110 denotes the area in which optional isolation trench regions 120 will be subsequently formed.

Figure 3C:
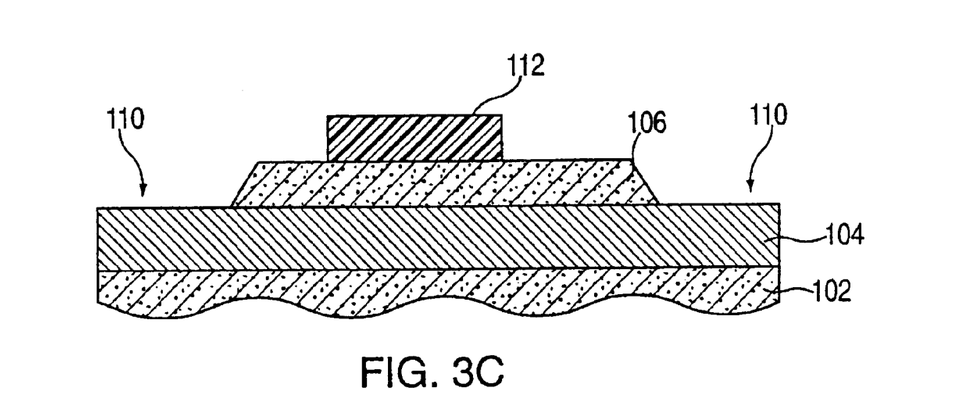

Mask 112 is then formed on a portion of patterned top Si-containing layer 106 utilizing a conventional process well known in the art including deposition of a hardmark material and patterning the hardmask material by lithography and etching. Note that mask 112 defines the area for the gate and serves to protect that area from the following implant steps. The resultant structure including mask 112 formed thereon is shown, for example, in FIG. 3C.

Figure 3D:
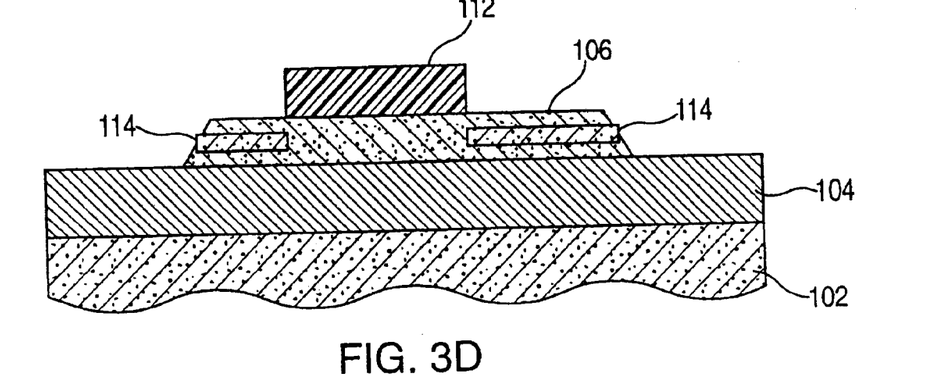

FIG. 3D shows the resultant structure that is obtained after forming porous silicon regions 114 in predetermined areas of the patterned top Si-containing layer that are not protected by mask 112. Specifically, the porous silicon regions are formed within a surface of the patterned top Si-containing layer utilizing an ion implantation process wherein H ions are implanted using a hydrogen ion dose of about $2\times10^{15}$ $cm^{-2}$ or greater and an implant energy of about 1.5 keV or greater. More preferably, the porous silicon regions are created by using a hydrogen ion dose of from about $2\times10^{16}$ to $1\times10^{17}$ $cm^{-2}$ and an implant energy of from about 2.0 to 3.0 keV. Using the above conditions, the porous silicon regions are implanted so as to divide portions of the patterned top Si-containing layer.

The top portion of the divided patterned top Si-containing layer above the porous silicon regions will be the area wherein source/drain diffusion regions will be formed, whereas the lower portion of the divided patterned top Si-containing layer will be the area wherein the buried interconnect plane of the present invention will be formed.

In one embodiment of the present invention, a deep implant region may be formed at this point of the present invention. The deep implant region is formed utilizing the ion implantation conditions mentioned hereinbelow. In other embodiments of the present, as is the case in the present drawings, the deep implant region is formed after the gate has been formed atop the patterned top Si-containing layer. Note that the deep implant region is the buried interconnect plane of the present invention.

After creating the porous silicon regions within the patterned top Si-containing layer, the mask is removed from the structure (via a conventional etching process) and a lateral etching process such as a KOH etching process is employed to remove the regions of porous silicon from the patterned top Si-containing layer so as to provide cavities 116 in the patterned top Si-containing layer. The resultant structure obtained after performing mask removal and the lateral etching step is shown, for example, in FIG. 3E.

Figure 3E:
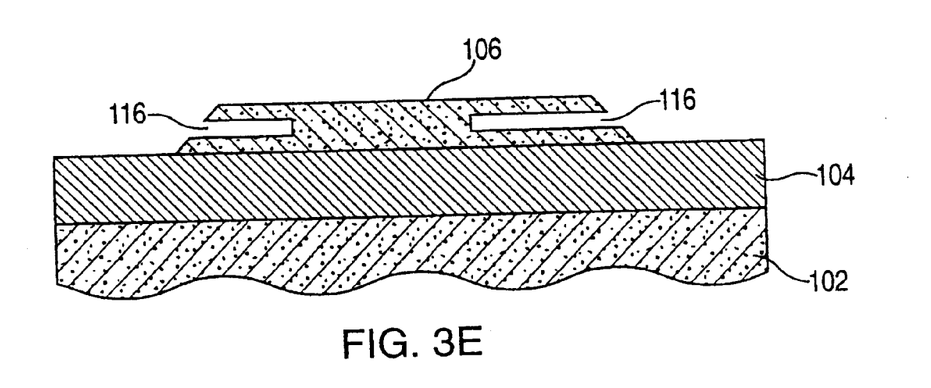
Figure 3F:
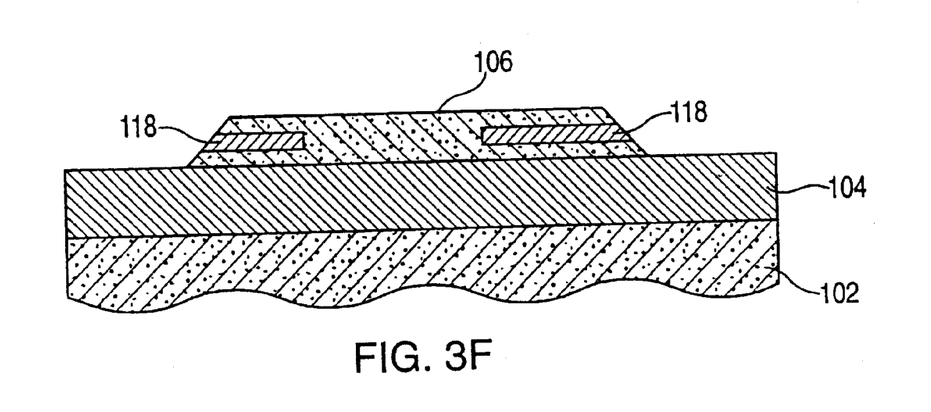

The structure shown in FIG. 3E is then subjected to an oxidation process which forms an oxide layer (thickness on the order of about 20 nm) on all exposed surfaces of the structure as well as within cavities 116 and thereafter a reactive-ion etching back process is performed so as to remove the oxide layer from the exposed surface layers of the structure. Note that the reactive-ion etch back step maintains the oxide within the cavities. The resultant structure having oxide filled cavities, i.e., isolation oxide regions 118, is shown in FIG. 3F.

Figure 3G:
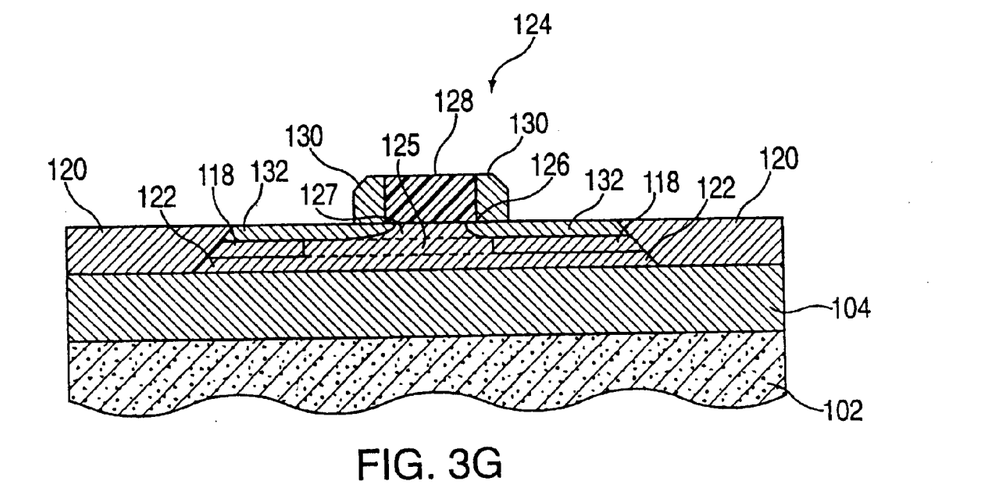

FIG. 3G shows the final structure which is obtained after performing the following processing steps: First, isolation trench regions 120 (which are not illustrated in FIG. 3G) are optionally formed in areas 110 utilizing conventional processes well known in the art. For example, the isolation trench regions can be formed by first forming a dielectric liner material on exposed sidewalls of areas 110, filling said region with a dielectric fill material such as tetrethylorthosilicate (TEOS), optionally densifying the dielectric fill material and planarizing the structure stopping on the uppermost surface of patterned top Si-containing layer 106. In some embodiments of the present invention, the formation of the isolation trench regions may be omitted.

Next, and if not previously done, a deep implant step is performed which converts the lower portion of the patterned top Si-containing layer 106 underneath the isolation oxide regions into buried interconnect plane 122. Specifically, the buried interconnect plane is formed by ion implanting either a p+-type dopant or an n+-type dopant into the patterned Si-containing layer using an ion dose of $2 \times 10^{15}$ cm$^{-2}$ or greater and an implant energy of about 1.5 keV or greater. More preferably, the buried interconnect plane is formed by ion implantation using an ion dose of from about $2 \times 10^{16}$ to $1 \times 10^{17}$ cm$^{-2}$ and an implant energy of from about 2.0 to 3.0 keV. Note that this deep implant step may be formed utilizing a masked or maskless ion implantation process. It is again emphasized that the deep implant step may occur immediately after formation of the porous silicon regions in the patterned top Si-containing layer.

Field effect transistor 124 is then formed atop the patterned top Si-containing layer. The field effect transistor is formed utilizing conventional processes well known in the art. For example, the field effect transistor is fabricated by first forming gate dielectric 126 on the exposed surface of patterned top Si-containing layer 106. The gate dielectric may be formed by a conventional deposition process such as CVD or plasma-assisted CVD, or alternatively, the gate dielectric may be formed by a thermal growing process such as oxidation, nitridation or oxynitridation.

The gate dielectric employed in the present invention includes any dielectric material such as an oxide, nitride, oxynitride or any combination and multilayer thereof. It is noted that the gate dielectric thus may be a conventional gate dielectric material such as $SiO_2$ or $Si_3N_4$, or alternatively, high-k dielectrics such as oxide of Ta, Zr, Hf, Al or combination thereof may be employed. In one highly preferred embodiment of the present invention, the gate dielectric is comprised of an oxide such as $SiO_2$, $ZrO_2$, $HfO_2$, $Ta_2O_5$ or $Al_2O_3$.

The thickness of the gate dielectric is not critical to the present invention, but typically, gate dielectric has a thickness of from about 1 to about 20 nm, with a thickness of from about 1.5 to about 10 nm being more highly preferred.

After forming the gate dielectric on the patterned top Si-containing layer, gate stack 128 is formed on the gate dielectric utilizing a conventional deposition process such as CVD, plasma-assisted CVD or plating. The gate stack of the present invention includes at least a gate material which may further contain an optional dielectric capping layer (not shown). The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals such as W, Pt, Pd, Ru, Rh and Ir, alloys of these elemental metals, suicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

The gate material is formed on the surface of gate dielectric 126 utilizing conventional deposition processes well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal, annealing the elemental metal so as to form a metal silicide layer therefrom, and removing any unreacted elemental metal utilizing a conventional wet etch process that has a high selectivity for removing unreacted metal as compared to silicide.

It is noted that in embodiments wherein a gate stack comprising at least two conductive materials is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

As stated above, an optional dielectric capping layer may be present atop the gate material. When present, the optional dielectric capping layer is comprised of an oxide, nitride or oxynitride and it is formed utilizing a conventional deposition process such as, for example, CVD or plasma-assisted CVD. Alternatively, a conventional thermal growing process such as, for example, oxidation may be used in forming the optional dielectric capping layer.

Following formation of the gate stack on the gate dielectric, the gate stack and gate dielectric are subjected to a conventional patterning process which includes a lithography step and an etching step. The lithography step includes, applying a photoresist to the gate stack, exposing the photoresist to a pattern of radiation, and developing the pattern utilizing a conventional resist developer. Following the lithography step, a conventional dry etching process such as reactive-ion etching, plasma etching, ion beam etching or laser ablation may be employed in transferring the pattern to the gate stack and the gate dielectric. Note a single etching step which is capable of selectively removing both the gate stack and the gate dielectric may be employed, or multiple etching steps can be performed which first removes the gate stack stopping on the gate dielectric and the gate dielectric is thereafter removed stopping on the top Si-containing layer.

At this point of the present invention, spacers 130 may be formed on exposed vertical sidewalls of the patterned gate region utilizing a conventional deposition process followed by etching. The spacers are comprised of a conventional dielectric material such an oxide, nitride, oxynitride or any combination and multilayers thereof. Note that source/drain extensions regions may be formed prior to spacer formation utilizing a conventional ion implantation and activation annealing processing scheme.

After forming the spacers on the structure, diffusion regions 132 are formed in structure by utilizing conventional ion implantation and activation annealing process well known in the art; diffusion regions 132 are the source/drain regions of the field effect transistor and they are separated from each other by body region 127. For example, n+-type dopant ions or p+-type dopant ions are implanted using an ion dose of about $1 \times 10^{15}$ cm$^{-2}$ or greater and an implant energy of about 1 keV or greater. More specifically, diffusion regions are formed using an ion dose of from about $3 \times 10^{15}$ cm$^{-2}$ to about $3 \times 10^{16}$ cm$^{-2}$ and an implant energy of from about 1 to 2 keV. Note that an angled or zero angled implanted may be employed at this stage of the present invention.

The activation annealing of the diffusion regions is carried out using conditions well known to those skilled in the art. For example, the activation annealing may be performed at a temperature of about 900° C. or greater, with a temperature of from about 950° to about 1050° C. being more highly preferred. The time of activation annealing may vary depending on whether a furnace annealing process or a rapid thermal annealing process is performed.

Following the above processing steps, the structure shown in FIG. 3G may be subjected to other conventional CMOS processing steps well known to those skilled in the art. For example, silicide contact regions can be formed on at least exposed surfaces of top Si-containing layer 106 utilizing conventional silicidation processes well known in the art, raised source/drain regions may be formed be forming an epi Si layer on the top Si-containing layer, and suicide contacts may formed on the epi Si layer.

The above description and FIGS. 3A–3G refer to the non-self-aligned embodiment of the present invention. The following description and FIGS. 4A–4G refer to the self-aligned embodiment of the present invention.

Figure 4A:
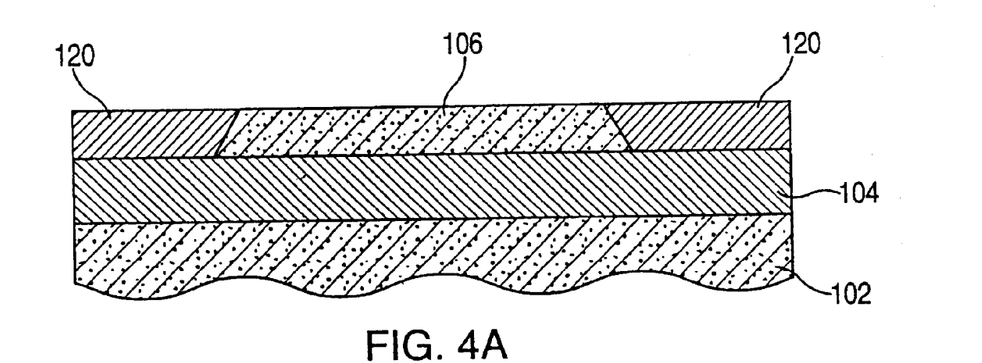
FIGS. 4A–4G are pictorial representations (through cross-sectional views) showing the inventive active-well SOI structure through various processing steps of the present invention using a self-aligned embodiment.

The initial structure used in this embodiment of the present invention is shown, for example, in FIG. 4A. Specifically, the structure shown in FIG. 4A comprises SOI substrate 100 having a patterned top Si-containing layer 106 present atop buried oxide layer 104. The patterned top Si-containing layer is formed utilizing the lithography and etching steps mentioned above in regard to the first embodiment of the present invention. Other portions of the buried oxide layer not containing the patterned top Si-containing layer may include isolation trench regions 120 which is formed utilizing the processing steps mentioned hereinabove. In some embodiments, isolation trench regions 120 is not present in the structure.

Figure 4B:
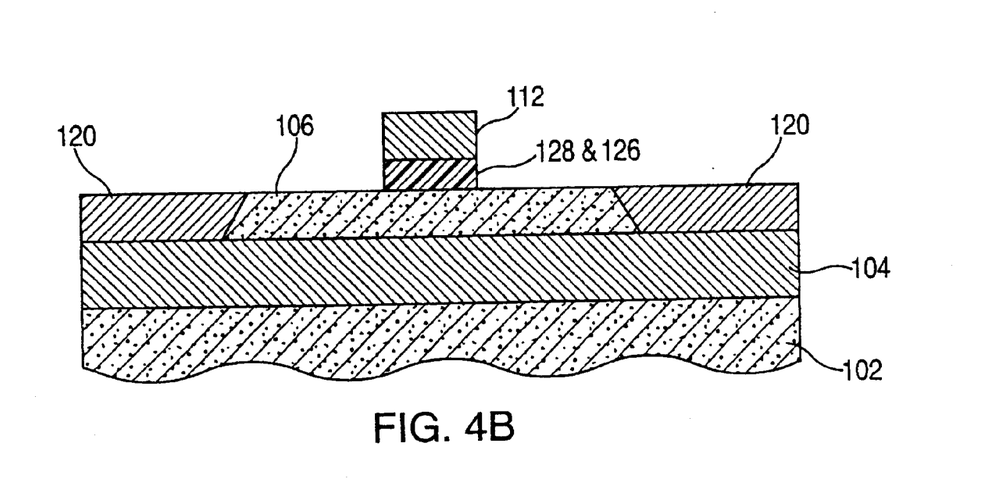

Following the formation of the isolation trench regions, gate dielectric 126 is formed on the patterned top Si-containing layer and thereafter gate stack 128 including at least a gate material is formed on the gate dielectric. Patterned hardmask 112, e.g., a nitride, is then formed on the gate stack utilizing conventional deposition, lithography and etching. With the patterned hardmask in place, the gate stack and underlying gate dielectric are etched utilizing conventional etching processes, as described hereinabove. The resultant structure obtained after the above steps have been performed is shown, for example, in FIG. 4B.

Figure 4C:
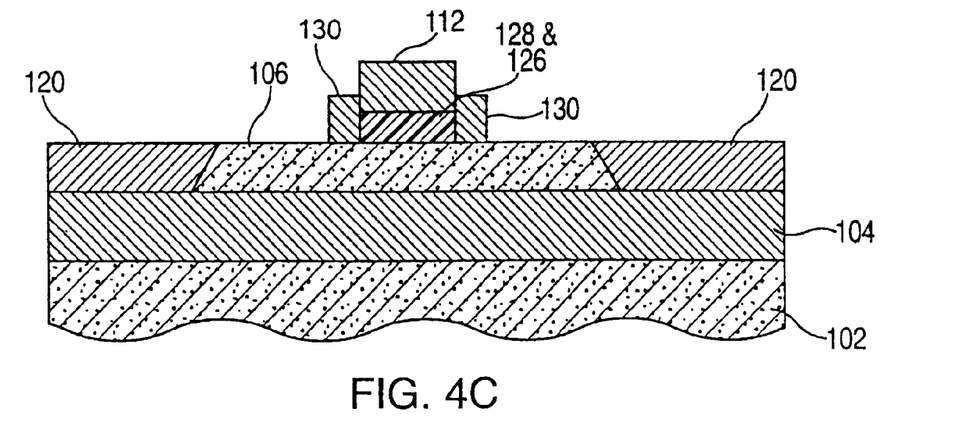

Spacers 130 are then formed on portions of the exposed vertical sidewalls of the patterned region so as to at least cover the gate stack utilizing conventional deposition and a spacer etch process which are well known in the art. The structure including spacers 130 is shown in FIG. 4C. Note that source/drain extension regions may be formed prior to forming the spacers on the structure.

Figure 4D:
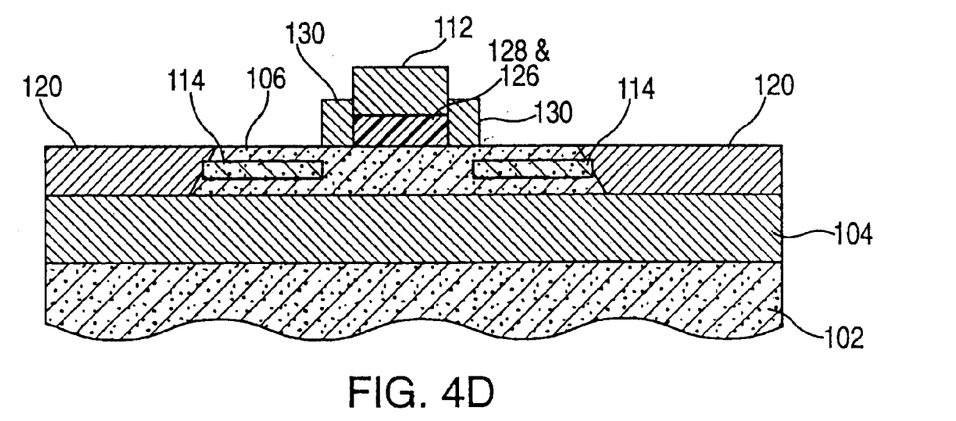

Porous silicon regions 114 are then formed in the top Si-containing layer utilizing the hydrogen ion implantation process mentioned above so as to provide the structure shown in FIG. 4D. Following the formation of the porous silicon regions within the patterned top Si-containing layer, it is possible to form the interconnect plane region beneath the porous Si regions using the deep ion implantation process mentioned above.

Figure 4E:
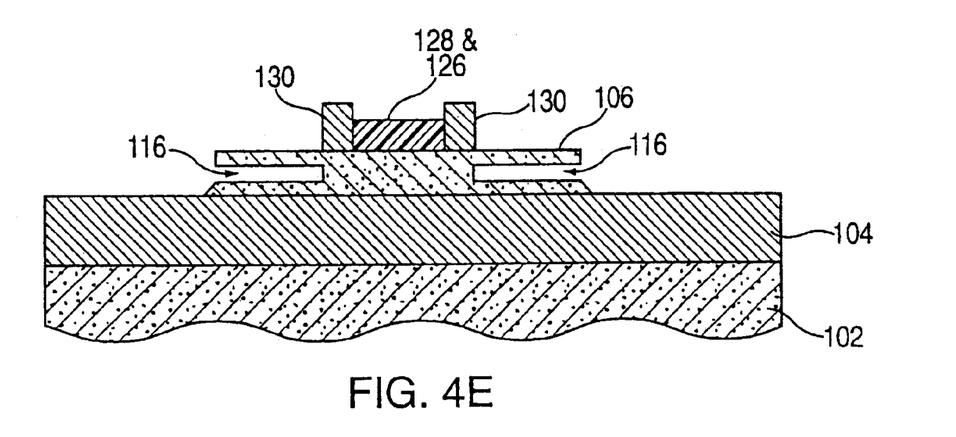

The structure shown in FIG. 4D is then subjected to a conventional etch back process such as reactive-ion etching which removes patterned hardmask 112 and, if present, the isolation trench regions from the structure. A lateral etching process such as mentioned above is then employed to remove the porous silicon regions from the top Si-containing layer. The resultant structure formed after these steps of the present invention is shown in FIG. 4E.

Figure 4F:
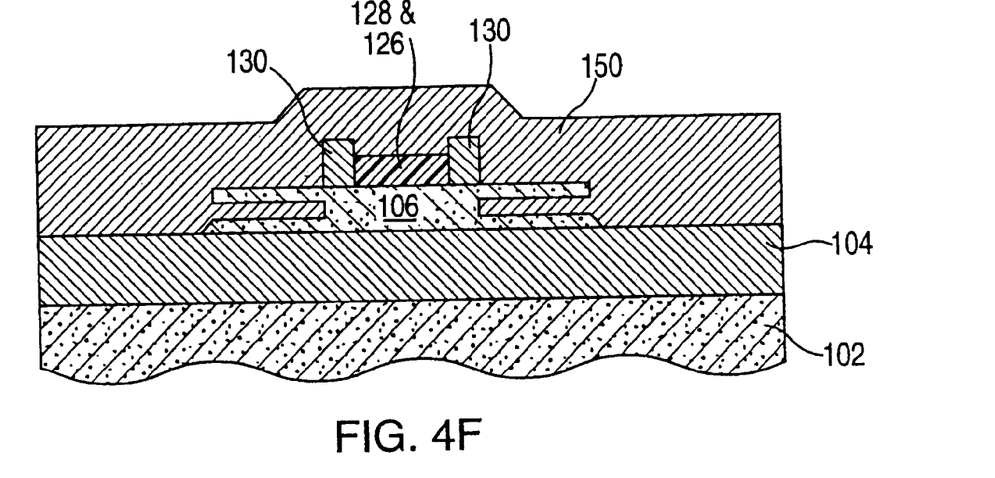

An oxide liner is then grown on the exposed surfaces of the structure utilizing a conventional oxidation process and thereafter an oxide layer is deposited utilizing a conventional deposition process well known in the art on the oxide liner so as to provide the structure, shown, for example in FIG. 4F. Note that in the structure shown in FIG. 4F reference numeral 150 is used to designate both the oxide liner and the oxide layer.

Figure 4G:
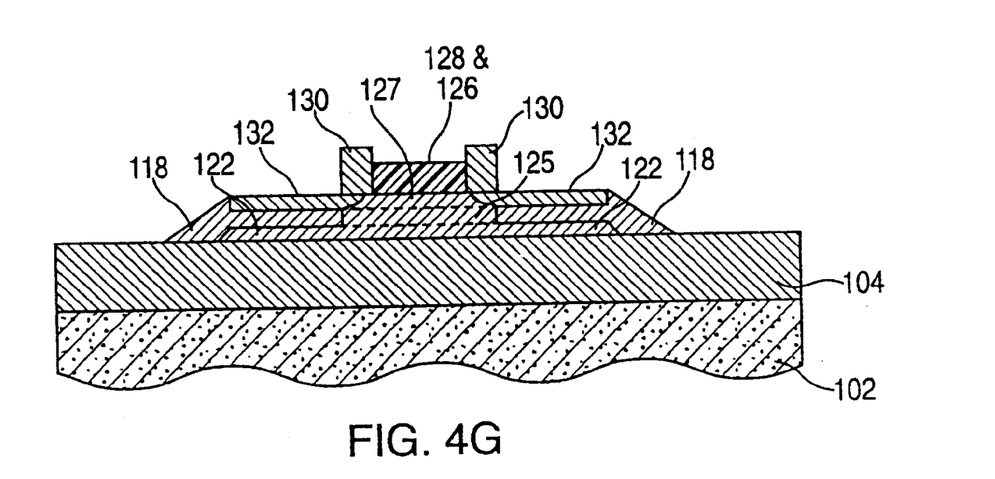

After formation of the oxide layers, the structure shown in FIG. 4F is subjected to a conventional reactive-ion etch back process forming the structure shown in FIG. 4G. Note that isolation oxide regions 118 are formed from these steps of the present invention.

Following the etch back step, diffusion regions 132 are formed as described hereinabove, i.e., via ion implantation and activation annealing. Conventional CMOS process steps, including those steps described above, may following the fabrication of the structure shown in FIG. 4G.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A non-self-aligned method of fabricating a semiconductor device on a silicon-on-insulator substrate, said method comprising the steps of:

forming a silicon-on-insulator (SOI) substrate, said SOI substrate having a patterned top Si-containing layer present atop a buried oxide region which includes areas that are exposed;

forming a mask over a portion of said patterned top Si-containing layer;

forming regions of porous Si in portions of said patterned top Si-containing layer not protected by said mask;

forming a buried interconnect plane in portions of said patterned top Si-containing layer that are located beneath said regions of porous Si;

removing the mask and the regions of porous Si from said patterned top Si-containing layer to provide a cavity in said regions previously occupied by porous Si;

forming an isolation region within said cavity; and forming a field effect transistor on a portion of said patterned top Si-containing layer, wherein said field effect transistor includes at least diffusion regions formed within said top Si-containing layer above said isolation oxide region, said diffusion regions being separated by a body region.

2. The method of claim 1 wherein said regions of porous Si are formed by a hydrogen ion implantation process.

3. The method of claim 2 wherein said hydrogen ion implantation process is performed using an implant dose of about $2 \times 10^{15}$ cm$^{-2}$ or greater and an implant energy of about 1.5 keV or greater.

4. The method of claim 1 wherein said field effect transistor is formed using the following steps: forming a gate dielectric on said patterned top Si-containing layer; forming a gate stack on said gate dielectric; patterning said gate stack and said gate dielectric; implanting diffusion regions within a surface of said patterned top Si-containing layer; and activating the implanted regions.

5. A self-aligned method of fabricating a semiconductor device on a silicon-on-insulator substrate, said method comprising the steps of:

forming an SOI substrate comprising at least a buried oxide region having a patterned top Si-containing layer formed on a portion of said buried oxide region;

forming a patterned gate level on a portion of said patterned top Si-containing layer, said patterned gate level including at least a hardmask formed atop a gate material;

forming sidewall spacers on portions of said patterned gate level;

forming porous Si regions within said patterned top Si-containing layer;

forming a buried interconnect plane in portions of said patterned top Si-containing layer that are located beneath said porous Si regions;

removing said hardmask and said porous regions, where removing said porous regions provides a cavity;

forming an oxide within said cavity and forming an oxide layer over said buried oxide region, said patterned top Si-containing layer, said sidewall spacers and said gate material; and etching back portions on said oxide layer to expose at least a portion of said patterned top Si-containing layer abutting said patterned gate level, while leaving oxide in at least said porous Si regions.

6. The method of claim 5 wherein said porous Si regions are formed by a hydrogen ion implantation process.

7. The method of claim 6 wherein said hydrogen ion implantation process is performed using an implant does of $2 \times 10^{15}$ cm$^{-2}$ or greater and an implant energy of 1.5 keV or greater.

8. A non-self-aligned method of fabricating a semiconductor device on a silicon-on-insulator substrate, said method comprising the steps of:

forming a silicon-on-insulator (SOI) substrate, said SOI substrate having a patterned top Si-containing layer present atop a buried oxide region which includes areas that are exposed;

forming a mask over a portion of said patterned top Si-containing layer;

forming regions of porous Si in portions of said patterned top Si-containing layer not protected by said mask;

removing the mask and the regions of porous Si from said patterned top Si-containing layer to provide a cavity in said regions previously occupied by porous Si;

forming an isolation region within said cavity;

forming a field effect transistor on a portion of said patterned top Si-containing layer, wherein said field effect transistor includes at least diffusion regions formed within said top Si-containing layer above said isolation oxide region, said diffusion regions being separated by a body region; and forming a buried interconnect plane in portions of said patterned top Si-containing layer that are located beneath diffusion regions.

* * * * *